(12) United States Patent
Perlmutter et al.

(10) Patent No.: US 8,059,457 B2
(45) Date of Patent: Nov. 15, 2011

(54) MEMORY DEVICE WITH MULTIPLE-ACCURACY READ COMMANDS

(75) Inventors: Uri Perlmutter, Ra'anana (IL); Ofir Shalvi, Ra'anana (IL); Yoav Kasorla, Seoul (KR); Naftali Sommer, Rishon Lezion (IL); Dotan Sokolov, Ra'anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 438 days.

(21) Appl. No.: 12/405,275

(22) Filed: Mar. 17, 2009

(65) Prior Publication Data

US 2009/0240872 A1 Sep. 24, 2009

Related U.S. Application Data

(60) Provisional application No. 61/119,929, filed on Dec. 4, 2008, provisional application No. 61/037,327, filed on Mar. 18, 2008.

(51) Int. Cl.
*G11C 11/34* (2006.01)
(52) U.S. Cl. ......... 365/185.03; 365/185.22; 365/189.07; 365/189.15
(58) Field of Classification Search ............. 365/185.03, 365/185.22, 189.07, 189.15
See application file for complete search history.

(56) References Cited

U.S. PATENT DOCUMENTS

| | | |
|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,191,584 A | 3/1993 | Anderson |
| 5,200,959 A | 4/1993 | Gross et al. |
| 5,237,535 A | 8/1993 | Mielke et al. |

(Continued)

FOREIGN PATENT DOCUMENTS

EP 0783754 B1 7/1997

(Continued)

OTHER PUBLICATIONS

U.S. Appl. No. 11/995,814 Official Action dated Dec. 17, 2010.

(Continued)

*Primary Examiner* — Viet Q Nguyen
(74) *Attorney, Agent, or Firm* — D. Kligler I.P. Services Ltd.

(57) ABSTRACT

A method for data storage includes defining at least first and second read commands for reading storage values from analog memory cells. The first read command reads the storage values at a first accuracy, and the second read command reads the storage values at a second accuracy, which is finer than the first accuracy. A condition is evaluated with respect to a read operation that is to be performed over a given group of the memory cells. One of the first and second read commands is selected responsively to the evaluated condition. The storage values are read from the given group of the memory cells using the selected read command.

43 Claims, 2 Drawing Sheets

U.S. PATENT DOCUMENTS

| | | | |
|---|---|---|---|
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,541,886 A | 7/1996 | Hasbun | |
| 5,600,677 A | 2/1997 | Citta et al. | |
| 5,638,320 A * | 6/1997 | Wong et al. | 365/185.03 |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A * | 11/1997 | Khan | 365/185.03 |
| 5,696,717 A | 12/1997 | Koh | |
| 5,726,649 A | 3/1998 | Tamaru et al. | |
| 5,726,934 A * | 3/1998 | Tran et al. | 365/185.2 |
| 5,742,752 A | 4/1998 | De Koning | |
| 5,748,533 A * | 5/1998 | Dunlap et al. | 365/185.19 |
| 5,748,534 A * | 5/1998 | Dunlap et al. | 365/185.21 |
| 5,751,637 A | 5/1998 | Chen et al. | |
| 5,761,402 A | 6/1998 | Kaneda et al. | |
| 5,798,966 A | 8/1998 | Keeney | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,969,986 A | 10/1999 | Wong et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,418,060 B1 | 7/2002 | Yong et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzales et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 * | 3/2004 | Khalid | 365/185.03 |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,809,964 B2 | 10/2004 | Moschopoulos et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzales et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,071,849 B2 | 7/2006 | Zhang | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,151,692 B2 | 12/2006 | Wu | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |

| | | |
|---|---|---|
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,388,781 B2 | 6/2008 | Litsyn et al. |
| 7,397,697 B2 | 7/2008 | So et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,568,135 B2 | 7/2009 | Cornwell et al. |
| 7,570,520 B2 | 8/2009 | Kamei et al. |
| 7,593,259 B2 | 9/2009 | Kim et al. |
| 7,596,707 B1 | 9/2009 | Vemula |
| 7,631,245 B2 | 12/2009 | Lasser |
| 7,633,798 B2 * | 12/2009 | Sarin et al. ............... 365/185.03 |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,761,624 B2 | 7/2010 | Karamcheti et al. |
| 7,810,017 B2 | 10/2010 | Radke |
| 7,848,149 B2 * | 12/2010 | Gonzalez et al. ........ 365/185.21 |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0133684 A1 | 9/2002 | Anderson |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |

| | | |
|---|---|---|
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0270730 A1 | 10/2008 | Lasser et al. |
| 2008/0282106 A1 | 11/2008 | Shalvi et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169743 A1 | 7/2010 | Vogan et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 2003100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

UBUNTU Forums, "Memory Stick Failed IO Superblock", posted Nov. 11, 2009.

Super User Forums, "SD Card Failure, can't read superblock", posted Aug. 8, 2010.

U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Huffman, A., "Non-Volatile Memory Host Controller Interface (NVMHCHI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed on Jun. 24, 2010.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
St Microelectronics, "Bad Block Management in NAND Flash Memories", Application note AN-1819, Geneva, Switzerland, May 2004.
St Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.

International Application PCT/IL2007/000579 Patentability report dated Mar. 10, 2009.
International Application PCT/IL2007/000579 Search report dated Jul 3, 2008.
International Application PCT/IL2007/000580 Patentability Report dated Mar. 10, 2009.
International Application PCT/IL2007/000580 Search Report dated Sep 11, 2008.
International Application PCT/IL2007/000581 Patentability Report dated Mar. 26, 2009.
International Application PCT/IL2007/000581 Search Report dated Aug 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug 7, 2008.
International Application PCT/IL2007/001315 Patentability Report dated May 5, 2009.
International Application PCT/IL2007/001316 Search report dated Jul 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov 25, 2008.
International Application PCT/IL2008/000519 Search report dated Nov 20, 2008.
International Application PCT/IL2008/001188 Search Report dated Jan 28, 2009.
International Application PCT/IL2008/001356 Search Report dated Feb 3, 2009.
International Application PCT/IL2008/001446 Search report dated Feb 20, 2009.
Perlmutter et al., U.S. Appl. No. 12/405,275 "Memory Device with Multiple-Accuracy Read Commands" filed on Mar. 17, 2009.
Sommer, N., U.S. Appl. No. 12/171,797 "Memory Device with Non-Uniform Programming Levels" filed on Jul. 11, 2008.
Shalvi et al., U.S. Appl. No. 12/251,471 "Compensation for Voltage Drifts in Analog Memory Cells" filed on Oct. 15, 2008.
U.S. Appl. No. 11/949,135 Official Action dated Oct. 2, 2009.
U.S. Appl. No. 12/880,101 "Reuse of Host Hibernation Storage Space by Memory Controller", filed on Sep. 12, 2010.
U.S. Appl. No. 12/890,724 "Error Correction Coding Over Multiple Memory Pages", filed on Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
US 7,161,836, 01/2007, Wan et al. (withdrawn)

* cited by examiner

MEMORY DEVICE WITH MULTIPLE-ACCURACY READ COMMANDS

CROSS-REFERENCE TO RELATED APPLICATIONS

This application claims the benefit of U.S. Provisional Patent Application 61/037,327, filed Mar. 18, 2008, and U.S. Provisional Patent Application 61/119,929, filed Dec. 4, 2008, whose disclosures are incorporated herein by reference.

FIELD OF THE INVENTION

The present invention relates generally to memory devices, and particularly to methods and systems for reading data from analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention provides a method for data storage, including:

defining at least first and second read commands for reading storage values from analog memory cells, such that the first read command reads the storage values at a first accuracy and the second read command reads the storage values at a second accuracy, which is finer than the first accuracy;

evaluating a condition with respect to a read operation that is to be performed over a given group of the memory cells;

selecting one of the first and second read commands responsively to the evaluated condition; and reading the storage values from the given group of the memory cells using the selected read command.

In some embodiments, the first read command has a first execution time, and the second read command has a second execution time that is longer than the first execution time. In an embodiment, reading the storage values includes sensing the storage values over a first sense time duration when using the first read command, and sensing the storage values over a second sense time duration, which is longer than the first sense time duration, when using the second read command. In another embodiment, reading the storage values includes comparing the read storage values to a first number of read thresholds when using the first read command, and comparing the read storage values to a second number of the read thresholds, which is larger than the first number, when using the second read command.

In a disclosed embodiment, reading the storage values includes applying to the read storage values a first signal processing process having a first execution time when using the first read command, and applying to the read storage values a second signal processing process having a second execution time, which is longer than the first execution time, when using the second read command. In an embodiment, the analog memory cells are includes in a memory device that is connected to a memory controller, applying the first signal processing process includes performing the first signal processing process by circuitry included in the memory device, and applying the second signal processing process includes performing the second signal processing process by the memory controller. In an embodiment, the first and second signal processing processes include interference cancellation processes.

In yet another embodiment, reading the storage values includes comparing the read storage values to one or more read thresholds, adaptively adjusting the read thresholds when using the second read command, and refraining from adaptively adjusting the read thresholds when using the first read command. In still another embodiment, reading the storage values includes canceling interference in the read storage values when using the second read command, and refraining from canceling the interference when using the first read command. In a disclosed embodiment, reading the storage values includes producing respective hard metrics of the read storage values when using the first read command, and producing respective soft metrics of the read storage values when using the second read command.

In some embodiments, the storage values in the given group of the memory cells represent stored data, and evaluating the condition and selecting the one of the read commands include making an attempt to read the storage values from the memory cells in the group and to reconstruct the stored data, and selecting the one of the first and second read commands responsively to the attempt. In an embodiment, the stored data is encoded with an Error Correction Code (ECC), and making the attempt includes decoding the ECC. In another embodiment, making the attempt includes reading the storage values using the first read command, and, responsively to a failure in reconstructing the stored data, re-attempting to read the storage values and reconstruct the stored data using the second read command. Re-attempting to reconstruct the stored data may include reconstructing the stored data using both the storage values read by the first read command and the re-read storage values read using the second read command.

In an embodiment, evaluating the condition includes assessing a wear level of the group of the memory cells. In another embodiment, evaluating the condition and selecting the one of the read commands include selecting the first read command responsively to determining that the read operation reads the storage values from potentially-interfering memory cells in an interference cancellation process. In yet another embodiment, evaluating the condition and selecting the one of the read commands include selecting the first read command responsively to determining that the read operation verifies the storage values that were written into the given group of the memory cells. In still another embodiment, each of the memory cells in the given group stores at least first and second bits, and evaluating the condition and selecting the one of the read commands include selecting the first read command responsively to determining that the read operation reads the first bits from the memory cells, and selecting the second read command responsively to determining that the read operation reads the second bits from the memory cells.

In some embodiment, evaluating the condition and selecting the one of the read commands include selecting the first read command responsively to determining that the read operation is used for estimating a statistical distribution of the storage values that were written into the given group of the memory cells. In an embodiment, the read commands have respective attributes, and defining the read commands includes configuring at least one of the attributes. Configuring the at least one attribute includes estimating an impairment in the analog memory cells, and setting the attribute responsively to estimated impairment.

There is additionally provided, in accordance with an embodiment of the present invention, apparatus for data storage, including:
 a plurality of analog memory cells; and
 circuitry, which is configured to execute at least first and second read commands for reading storage values from the analog memory cells, such that the first read command reads the storage values at a first accuracy and the second read command reads the storage values at a second accuracy that is finer than the first accuracy, and which is operative to evaluate a condition with respect to a read operation that is to be performed over a given group of the memory cells, to select one of the first and second read commands responsively to the evaluated condition, and to read the storage values from the given group of the memory cells using the selected read command.

In some embodiments, the analog memory cells are arrayed in a memory device, and the circuitry includes:
 first circuitry, which is included in the memory device and is coupled to receive the selected one of the first and second read commands over an interface and to read the storage values at a respective one of the first and second accuracies; and
 second circuitry, which is separate from the memory device and is coupled to evaluate the condition, to select the one of the first and second read commands and to send the selected command to the first circuitry over the interface for execution.

There is also provided, in accordance with an embodiment of the present invention, apparatus for data storage, including:
 a plurality of analog memory cells; and
 circuitry, which is coupled to receive a given read command for reading respective storage values from a given group of the analog memory cells, wherein the given read command is selected from at least a first read command that reads the storage values at a first accuracy and a second read command that reads the storage values at a second accuracy that is finer than the first accuracy, and to read the storage values from the given group of the memory cells at one of the first and second accuracies corresponding to the given read command.

The present invention will be more fully understood from the following detailed description of the embodiments thereof, taken together with the drawings in which:

DETAILED DESCRIPTION OF EMBODIMENTS

Overview

Figure 1:
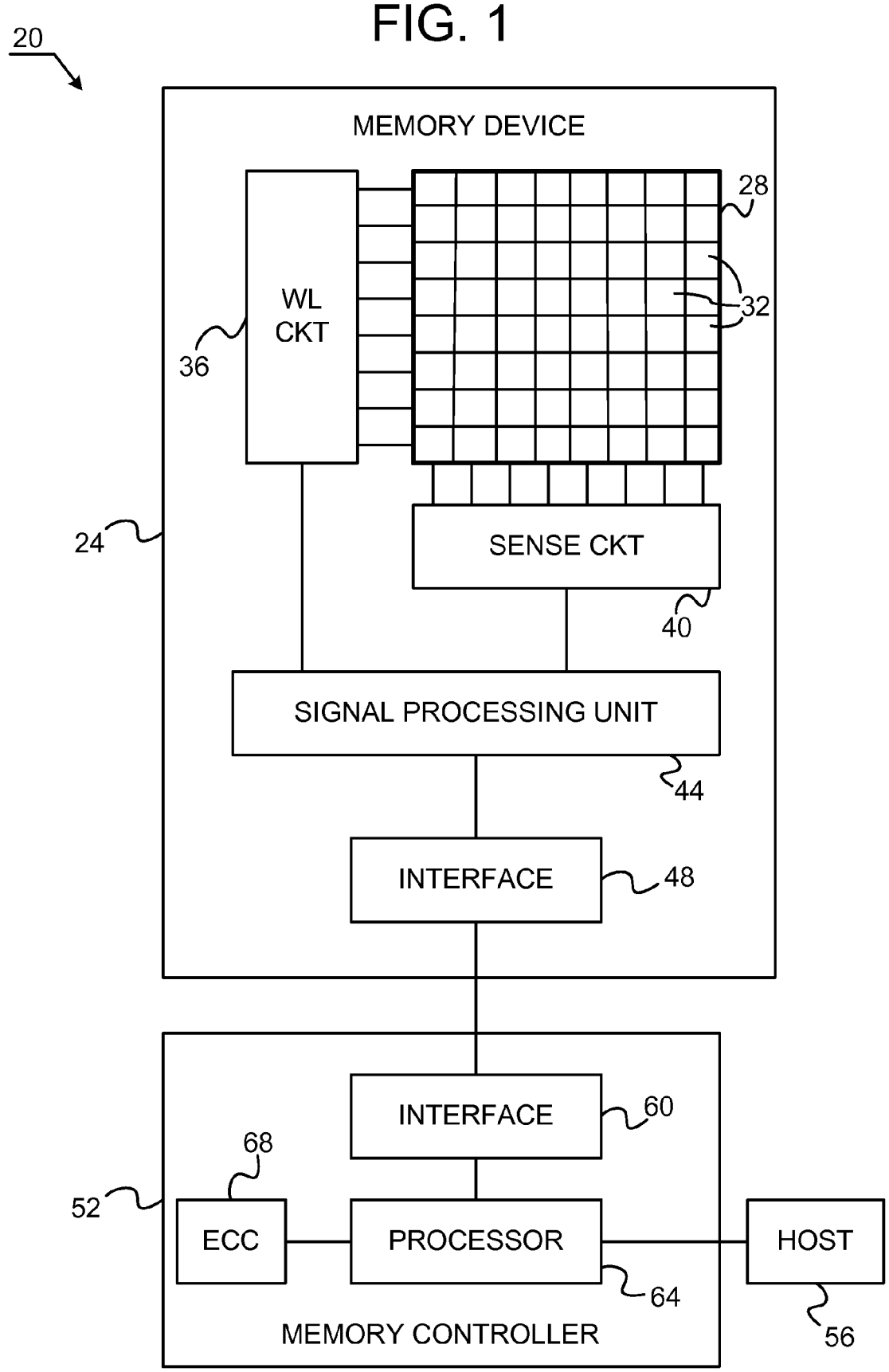
FIG. 1 is a block diagram that schematically illustrates a memory system, in accordance with an embodiment of the present invention.

Data is typically stored in analog memory cells by programming the cells with certain storage values (e.g., threshold voltages) that represent the data. The data is retrieved by reading the storage values from the cells. Usually, a trade-off exists between the accuracy at which the storage values are read and the time needed to read them. Highly-accurate read operations tend to be relatively long and may limit the overall data retrieval speed.

In practice, however, highly-accurate readout is not always mandatory. Some readout tasks can be carried out successfully at a reduced accuracy, and therefore at a higher speed. Reduced accuracy can be sufficient, for example, when the memory cells are at the beginning of their life cycle and thus have gone through only few programming and erasure cycles. As another example, when canceling interference in given memory cells based on the storage values of neighboring cells, the given cells are typically read with high accuracy. The neighboring cells, however, can often be read with lower accuracy with little or no degradation in cancellation performance. As yet another example, when programming the cells using a Program and Verify (P&V) process, the programmed storage values can be verified at a lower accuracy than the accuracy used for data retrieval. Read operations for estimating the statistical distribution of the storage values (e.g., for adjusting read thresholds) can often be performed at lower accuracy, as well.

Embodiments of the present invention that are described hereinbelow provide improved methods and systems for reading data from analog memory cells. These methods and systems use a predefined set of read commands, which have different respective accuracies and execution times. Typically, higher-accuracy commands have higher execution times, and vice versa. In preparation for reading the storage values from a group of analog memory cells, a condition related to the read operation is evaluated. One of the predefined reading commands is selected based on the evaluated condition, and the storage values are read using this command at the appropriate accuracy level and execution time.

Different read commands may differ from one to another is several ways, which affect their accuracy and execution time. For example, different read commands may have different sense times, i.e., measure the storage values over different time durations. As another example, different read commands may read the storage values using different numbers of read thresholds, i.e., apply different numbers of re-read operations in order to divide the range of possible values more finely or coarsely. As yet another example, some read commands may apply signal processing mechanisms, such as interference cancellation or read threshold tracking, which enhance the reading accuracy but increase the execution time. Other read commands may read the storage values without using these mechanisms, thus reducing execution time at the cost of reduced accuracy. In some embodiments, data is initially read using a fast, low-accuracy command. If the read operation fails, readout is re-attempted using a higher-accuracy read command.

When using the methods and systems described herein, readout tasks that require high accuracy are performed using slower commands. Other readout tasks, which can tolerate a lower reading accuracy, are carried out using lower-accuracy, faster read commands. Thus, the disclosed methods provide a considerable increase in average readout speed from analog memory cells, with little or no degradation in other performance measures.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. Memory device 24 and memory controller 52 support multiple read commands, which read memory cells 32 at different accuracy levels and have different execution times. The use of these multiple read commands is addressed in detail hereinbelow. In some embodiments, the memory device and memory controller communicate with each other using a dedicated command interface in order to implement the multiple read commands defined herein.

In the context of the present patent application and in the claims, the term "analog memory cell" is used to describe any memory cell that holds a continuous, analog level of a physical quantity, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

Memory cells 32 of array 28 are typically arranged in a grid having multiple rows and columns, commonly referred to as word lines and bit lines, respectively. Cells are typically erased in groups of word lines that are referred to as erasure blocks. In some embodiments, a given memory device comprises multiple memory cell arrays, which may be fabricated on separate dies.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming states are selected from a finite set of possible states, and each state corresponds to a certain nominal storage value. For example, a 2 bit/cell MLC can be programmed to assume one of four possible programming states by writing one of four possible nominal storage values to the cell.

Memory device 24 comprises Reading/Writing (R/W) circuitry, which converts data for storage in the memory device to storage values and writes them into memory cells 32. In alternative embodiments, the R/W circuitry does not perform the conversion, but is provided with voltage samples, i.e., with the storage values for storage in the cells. When reading data out of array 28, the R/W circuitry converts the storage values of memory cells 32 into digital samples having a resolution of one or more bits. The R/W circuitry typically reads data from cells 32 by comparing the storage values of the cells to one or more read thresholds. Data is typically written to and read from the memory cells in groups that are referred to as pages. In some embodiments, the R/W circuitry can erase a group of cells 32 by applying one or more negative erasure pulses to the cells.

In the present example, the R/W circuitry comprises Word Line (WL) circuitry 36 and sense circuitry 40. The WL circuitry is connected to the word lines of array 28, and the sense circuitry is connected to the bit lines of the array. Among other tasks, WL circuitry 36 applies appropriate bias voltages to the different word lines during read operations, and applies appropriate programming pulses to word lines during programming operations. Sense circuitry 40, among other functions, senses the voltages or currents of the bit lines during read operations.

The R/W circuitry typically reads a group of memory cells 32 along a certain word line simultaneously. In a typical read operation, WL circuitry 36 applies the appropriate bias voltages to the read word line and to the other word lines in the same erasure block. Sense circuitry 40 senses the voltage or current of each bit line. The sensed voltage or current of a given bit line is indicative of the storage value of the memory cell that belongs to this bit line and to the read word line. The sense circuitry typically compares the sensed bit line voltages or currents to one or more read thresholds, and outputs the comparison results.

In some embodiments, memory device 24 comprises a signal processing unit 44, which applies various signal processing mechanisms to the read and/or programmed data or storage values. In particular, unit 44 may apply signal processing mechanisms that enhance the accuracy of reading the storage values from memory cells 32, such as interference cancellation or read threshold adaptation. The use of these mechanisms is addressed in greater detail below. Signal processing unit 44 communicates with WL circuitry 36 and with sense circuitry 40. Additionally, the signal processing circuitry communicates with elements external to device 24 via an interface 48.

The storage and retrieval of data in and out of memory device 24 is performed by a memory controller 52. Controller 52 comprises an interface 60 for communicating with device 24, and a processor 64 that carries out the memory control functions described herein. In some embodiments, memory controller 52 comprises an Error Correction Code (ECC) unit 68, which encodes the data for storage using a suitable ECC, and decodes the ECC of data read from the memory device. In some embodiments, controller 52 produces the storage values for storing in the memory cells and provides these values to device 24. Alternatively, controller 52 may provide the data for storage, and the conversion to storage values is carried out in the memory device.

Memory controller 52 communicates with a host 56, for accepting data for storage in the memory device and for outputting data retrieved from the memory device. In some embodiments, some or even all of the functions of controller 52 may be implemented in hardware. Alternatively, controller 52 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, in some embodiments signal processing unit 44 may be omitted, and its functions performed by the memory controller. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and memory controller 52 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the circuitry of the memory controller may reside on the same die on which the memory array is disposed. Further alternatively, some or all of the functionality of controller 52 can be implemented in software and carried out by a processor or other element of the host system. In some implementations, a single memory controller may be connected to multiple memory devices 24. In yet another embodiment, some or all of the memory controller functionality may be carried out by a separate unit, referred to as a memory extension, which acts as a slave of memory device 24. Typically, processor 64 in controller 52 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Trade-Off Between Readout Accuracy and Speed

Typically, a trade-off exists between the accuracy at which memory device 24 reads the storage values from memory cells 32, and the speed at which the storage values are read. Highly-accurate readout tends to be relatively slow, whereas fast readout often has a reduced accuracy. In the present context, the term "accuracy" means any measure of the certainty or fidelity at which the storage values read by the circuitry of memory device 24 represent the actual storage values stored in the memory cells. In an accurate read operation, the differences between the read storage values and the respective actual storage values of the memory cells are small, and vice versa. Since any read operation has some inherent uncertainty, different read operations can be characterized by their reading accuracies. Several examples of read commands having different accuracies are described further below. The terms "high accuracy" and "fine accuracy" are used interchangeably herein.

In many practical cases, highly-accurate readout is not always needed. Some readout tasks can be carried out successfully at a reduced reading accuracy, and therefore at a higher speed. In some embodiments, memory device 24 and memory controller 52 support multiple predefined types of read commands for reading the storage values from memory cells 32. The different commands read the storage values at different accuracies. Each command has a respective execution time, which is typically longer for higher-accuracy commands and shorter for lower-accuracy commands.

Typically, when memory controller 52 prepares to read the storage values from a certain group of memory cells (e.g., a memory page), the controller evaluates a condition related to the read operation to be performed. Based on the evaluated condition, the memory controller selects one of the predefined read commands, and instructs the memory device to read the storage values in question using the selected command. Several examples of readout tasks that can be performed at different accuracy levels, of conditions that can be evaluated so as to select the appropriate read command, and of read commands having different accuracies and execution times, are described in detail below.

Figure 2:
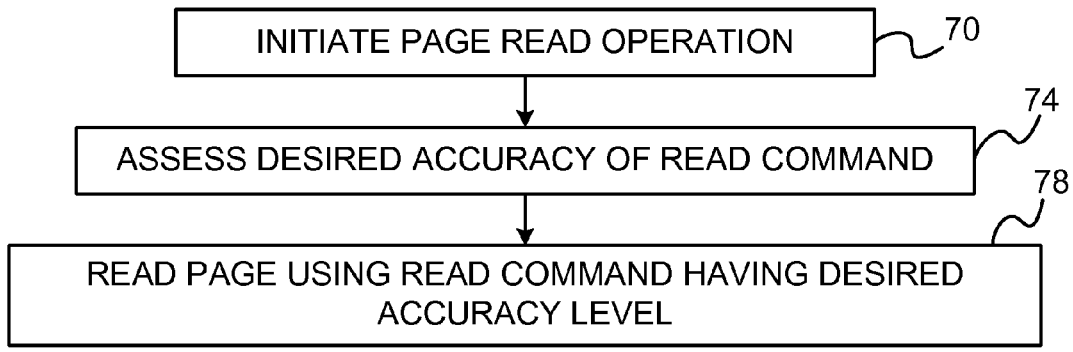
FIGS. 2 and 3 are flow charts that schematically illustrate methods for retrieving data from analog memory cells using read commands having different accuracy levels, in accordance with embodiments of the present invention.

FIG. 2 is a flow chart that schematically illustrates a method for retrieving data from analog memory cells 32 using read commands having different accuracy levels, in accordance with an embodiment of the present invention. The method begins with memory controller 52 initiating readout of a certain memory page, which is stored in a group of memory cells 32, at an initiation step 70. The memory controller assesses the desired readout accuracy by evaluating a condition related to the read operation to be performed, at an accuracy assessment step 74. The memory controller selects one of the predefined read commands, which has the desired accuracy, and reads the storage values corresponding to the page using the selected command, at a reading step 78. The memory controller typically reconstructs the stored data from the read storage values and outputs the reconstructed data to host 56.

Example Readout Tasks, Selection Criteria and Read Commands

The different read commands supported by memory device 24 and memory controller 52 may differ from one another in various ways, in order to provide different accuracy/speed trade-offs. For example, different read commands may have different sense times. The sense time is defined as the time duration over which sense circuitry 40 measures the bit line voltages or currents during a read operation. As can be appreciated, integrating the bit line current or voltage over a longer time duration averages the read noise and improves the readout accuracy. On the other hand, a longer sense time increases the execution time of the read command. Thus, device 24 and controller 52 may support a high-accuracy but relatively slow read command having a long sense time, and a lower-accuracy but relatively fast read command having a short sense time. In a certain NAND Flash device, for example, the long sense time may be on the order of 25 μS and the short sense time may be on the order of 10 μS, although any other suitable values can also be used. In some embodiments, the long sense time may be approximately twice the length of the short sense time, although any other suitable ratio can also be used.

As another example, different read commands may read the storage values using different numbers of read thresholds. As noted above, the R/W circuitry typically reads the storage values from memory cells 32 by comparing them to one or more read thresholds. In some embodiments, signal processing unit 44 can improve the reading accuracy by re-reading a certain set of storage values multiple times, using different read thresholds. For example, the multiple read results can be combined to form soft metrics of the read storage values, and these metrics can be used by ECC unit 68 in the memory controller to decode the ECC. Some aspects of data readout using multiple read thresholds are addressed in PCT International Publications WO 2007/132457, WO 2008/053472, WO 2008/111058 and WO 2008/139441, whose disclosures are incorporated herein by reference.

Typically, the readout accuracy improves as the number of read thresholds increases. On the other hand, re-reading a group of memory cells using a large number of read thresholds increases execution time. Thus, read commands that use different numbers of read thresholds will typically have different reading accuracies and execution times. In an embodiment, the memory device and memory controller may support a read command that reads the storage values using a small number of read thresholds (e.g., a single read threshold), and another read command that reads the storage values using a higher number of read thresholds (e.g., between two and five read thresholds).

When a given read commands uses a single read threshold, the read results can be viewed as hard metrics of the storage values. When a given read command uses multiple read thresholds, the read results can be combined or otherwise processed to produce soft metrics of the storage values. ECC unit 68 may decode the ECC based on these hard or soft metrics. Thus, a relatively fast command can be specified to produce hard metrics. A slower command may be specified to produce soft metrics, which generally enable higher accuracy in decoding the ECC. Alternatively, different commands that use different numbers of read thresholds can be viewed as producing soft metrics having different accuracies.

Typically, multiple-threshold readout is carried out by unit 44 internally to the memory device. In a typical process, the memory controller selects and sends the appropriate read command to the memory device, and the memory device executes the command by reading the storage values using the appropriate number of read thresholds.

In some embodiments, signal processing unit 44 applies certain signal processing mechanisms to the read storage values in order to increase their accuracy. For example, unit 44 may apply an interference cancellation process for canceling interference that distorts the read storage values. Techniques for estimating and cancelling distortion in memory cells are described, for example, in PCT International Publications WO 2007/132452, WO 2007/132453 and WO 2008/026203, whose disclosures are incorporated herein by reference, and in PCT International Publications WO 2007/132457, cited above. As another example, signal processing unit 44 may apply a mechanism that adaptively adjusts the positions of the read thresholds that are used for reading the storage values. Techniques for adaptively adjusting read threshold values are described, for example, in PCT International Publications WO 2008/053472 and WO 2008/111058, cited above.

Signal processing mechanisms, such as interference cancellation or adaptive threshold adjustment, improve the readout accuracy. On the other hand, these mechanisms are typically computationally intensive and therefore increase execution time and readout speed. Thus, in some embodiments, different read commands can apply signal processing mechanisms having different execution times, or refrain from applying such mechanisms, and as a result provide different accuracy/speed trade-offs.

For example, a given read command may apply interference cancellation to the read storage values, and another read command may read the storage values without applying interference cancellation. As another example, a given read command may adjust the read thresholds before reading the storage values, and another read command may read the storage values without adjusting the read thresholds.

In some embodiments, both unit 44 and memory controller 52 have signal processing capabilities. For example, an interference cancellation process or threshold adjustment process can be split between unit 44 and processor 52, such that each entity carries out a subset of the signal processing tasks. Memory controller 52 is often capable of carrying out complex signal processing tasks as it often has a higher processing power than unit 44. Thus, moving signal processing functions from unit 44 to controller 52 may improve the readout accuracy. On the other hand, performing signal processing tasks by the memory controller often involves transferring larger volumes of data from the memory device to the memory controller, which increases the execution time. Thus, the partitioning of signal processing tasks between the memory controller and the memory device may provide different accuracy/speed trade-offs. Therefore, different read commands may split the signal processing tasks differently between the memory controller and the memory device.

For example, a certain read command may apply a fast but limited-accuracy threshold adaptation process internally to the memory device. Another read command may apply a more complex and higher-accuracy threshold adaptation process by the memory controller. The latter command is typically slower, since it involves transferring of larger amounts of data (results of re-read operations) from the memory device to the memory controller.

As another example, unit 44 in the memory device may be configurable to perform a limited-performance interference cancellation process on the data read from the memory cells. Memory controller 52 may be configurable to perform a high-performance interference cancellation process, which may be slower than the process applied internally to the memory device. A certain read commands may use only the interference cancellation process applied in the memory device. Another read command may use only the controller's interference cancellation process. Yet another read command may apply both processes to the read data.

The read commands described above are chosen purely by way of example. In alternative embodiments, memory device 24 and memory controller 52 may use any other suitable set of two or more predefined read commands, which have different readout accuracies and execution times. In particular, the example techniques described above can be combined to produce commands having various accuracy/trade-offs. For example, a highly-accurate read command may use a long sense time, apply interference cancellation and read the storage values using multiple thresholds that are adjusted adaptively. A low-accuracy but high-speed read command may use a short sense time and read the storage values using a single, fixed read threshold.

Memory controller 52 may evaluate different conditions in order to select one of the predefined read commands for performing a given readout task. For example, a group of memory cells that has gone through a large amount of wear (e.g., a large number of programming and erasure cycles and/or long retention periods) may suffer from a high level of distortion, and should therefore be read at high accuracy. A group of memory cells that has gone through a small amount of wear may be read successfully at a lower accuracy and at a higher speed. Thus, in some embodiments, the memory controller selects the read command based on the wear level of the memory cells to be read. Any suitable measure or estimate of the wear level can be used, such as the actual or estimated number of programming and erasure cycles applied to the cells, and/or the time that elapsed since the last programming operation.

This sort of condition may be applied to each individual group of cells, assuming that wear level information is available per cell group. Alternatively, the memory controller may apply the selection jointly for an entire block or even to the entire memory device. For example, the memory controller may use a fast but low-accuracy read command at the beginning of the memory device's lifetime, and switch to a higher-accuracy but slower read command at a later point along the lifetime of the memory device.

As another example, the memory controller may initially select a fast read command by default. If the data cannot be reconstructed successfully using this read command (e.g., if ECC decoding fails), the memory controller may re-attempt to read the storage values using a slower but higher-accuracy command.

In some embodiments, the read command is selected internally in the memory device, such as by signal processing unit 44 or by the R/W circuitry. For example, applying interference cancellation to a certain group of memory cells typically involves reading the storage values from both the interfered memory cells and other memory cells (typically neighboring cells) that potentially cause the interference. In many practical cases, the interference can be canceled successfully even if the storage values of the interfering memory cells are known at a low accuracy. Thus, when applying interference cancellation, the memory device may read the storage values of the potentially-interfering cells using a fast but low-accuracy command.

In some embodiments, memory cells 32 comprise multi-level cells, each storing multiple data bits. In many data storage schemes, different bits in a group of memory cells are used for storing different memory pages. Consider, for example, a group of 3 bit/cell memory cells. Each memory cell stores three bits, which are referred to as a Least Significant Bit (LSB), a Center Significant Bit (CSB) and a Most Significant Bit (MSB). The LSBs of the cells in the group are used for storing a certain page, the CSBs store a different page, and yet another page is stored in the MSBs. In these embodiments, the pages stored in different significance bits often have different error probabilities. Therefore, different significance bits can be read using different read commands. This selection can be performed either by the memory controller or by the memory device, as appropriate.

As yet another example, the R/W circuitry may program the memory cells using an iterative Program and Verify (P&V) process. In a typical P&V process, an entire memory page is written by applying a sequence of programming pulses to the group of memory cells that are mapped to this page. The amplitude of the programming pulses increases incrementally from pulse to pulse. The storage values programmed into the cells are read ("verified") after each pulse, and the iterations continue until the desired levels are reached. Typically, programming verification can be performed successfully even if the storage values are read at a low accuracy. Thus, the R/W circuitry may read the storage values during verification reading tasks using a fast but low-accuracy command.

As another example, in some embodiments the memory device or the memory controller adjusts the read thresholds used in read operations, based on the statistical distribution of the storage values stored in the memory cells. For example, device 24 or controller 52 may perform one or more read operations for estimating the Cumulative Distribution Function (CDF) of the cell storage values, and then adjust the read thresholds based on the estimated CDF. Techniques of this sort are described, for example, in PCT International Publication WO 2008/111058, cited above. Typically, read operations performed in order to estimate the storage value distribution can be performed at low accuracy.

Further alternatively, the appropriate predefined read command for performing a certain readout task can be selected based on any other suitable condition. For example, two or more of the above-mentioned conditions can be combined. Although certain conditions are referred to above as being evaluated by the memory controller, the condition evaluation and/or command selection can be performed by the memory controller or by circuitry internal to the memory device, as desired.

In some embodiments, the memory controller configures the memory device so as to set various attributes of the read commands. The memory controller may configure any read command attribute, such as, for example, the number and values of read thresholds, sense times and/or interference cancellation parameters. The controller may configure attributes of a single read command, all commands or a subset of the commands. In some embodiments, the memory controller may estimate the impairments in the memory cells along the memory device's life cycle, and adapt the read command attributes accordingly.

Progressive Selection of Read Commands

In some embodiments, memory controller 52 initially reads data from memory device 24 using fast and limited-accuracy read commands. The memory controller reverts to higher-accuracy but slower read commands only if data readout fails.

Figure 3:
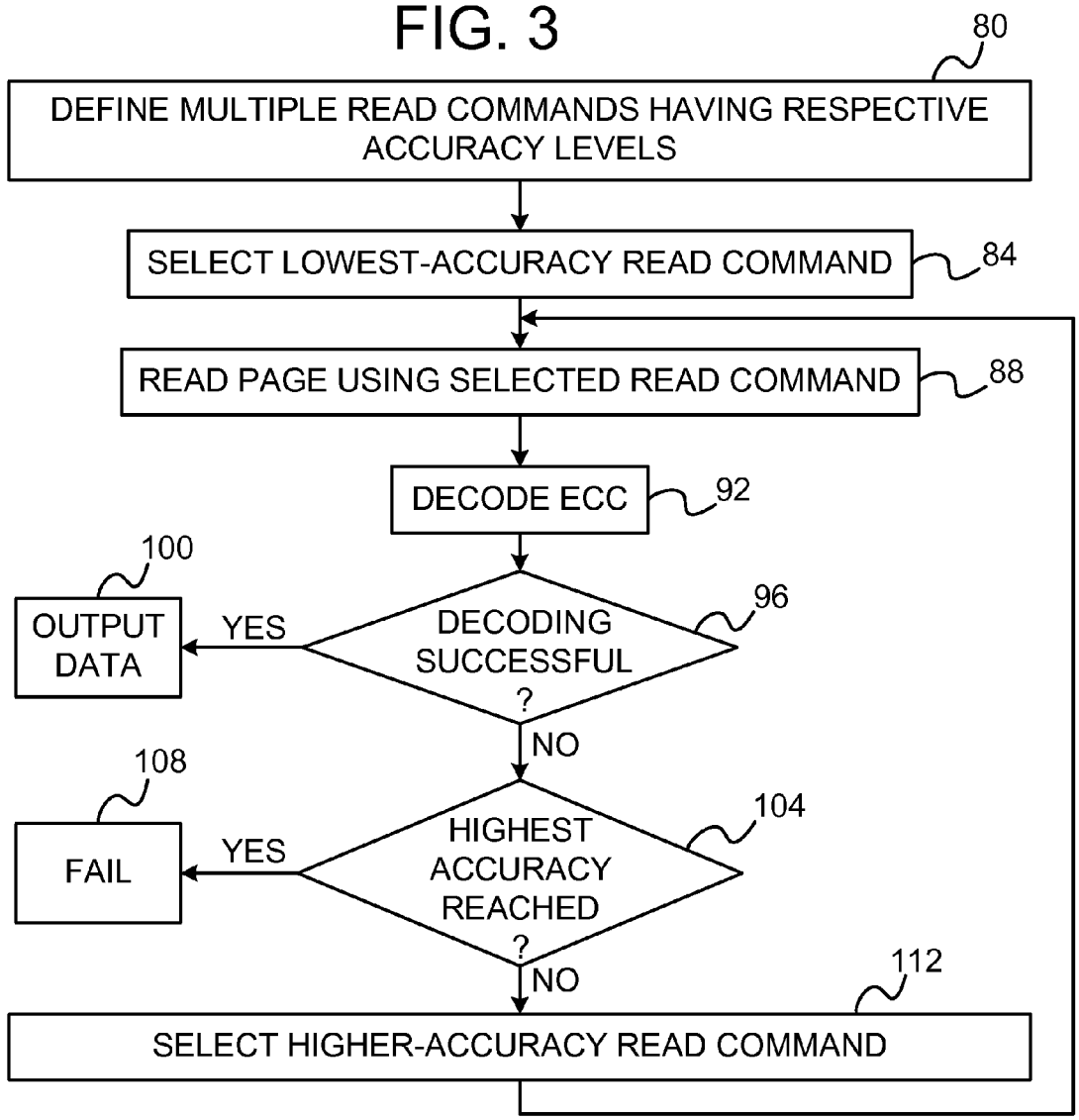

FIG. 3 is a flow chart that schematically illustrates a method for retrieving data from analog memory cells 32 using read commands having different accuracy levels, in accordance with an embodiment of the present invention. The method begins by defining multiple read commands having respective different accuracy levels, at a definition step 80. These commands are supported by both memory device 24 and memory controller 52.

When preparing to read the storage values from a certain group of memory cells (e.g., to read a certain memory page), the memory controller initially selects the read command having the lowest accuracy, at an initial selection step 84. This command typically has the shortest execution time.

The memory controller instructs the memory device to read a certain page using the currently-selected read command, at a reading step 88. The memory device reads the requested page using this command and provides the read results to the memory controller.

The memory controller attempts to decode the ECC based on the read results provided by the memory device, in order to reconstruct the data, at an ECC decoding step 92. The memory controller checks whether ECC decoding is successful, at a decoding checking step 96. If successful, the memory controller output the reconstructed data to host 56, at an output step 100, and the method terminates.

If, on the other hand, ECC decoding has failed, the memory controller checks whether the currently-selected read command is the command having the highest accuracy, at an accuracy checking step 104. If the currently-selected read command is the highest-accuracy command, the memory controller declares that the page read operation has failed, at a failure step 108, and the method terminates.

Otherwise, the memory controller selects a different read command, whose accuracy is higher than that of the currently-selected command, at a selection update step 112. The method then loops back to step 88 above, in which the memory controller reads the requested page using the newly-selected read command. The memory controller continues to read the requested page using read commands that progressively increase in accuracy, until ECC decoding is successful or until all predefined commands have been exhausted.

Using the progressive method of FIG. 3, the readout accuracy is matched to the actual characteristics of the page in question. The memory controller attempts to read the data using fast read commands first, and reverts to slower commands only if higher accuracy is needed.

When the memory controller re-reads a certain page using a high-accuracy command after failure of a lower-accuracy command, the memory controller can still use the results of the lower-accuracy command that failed. For example, the results of the lower-accuracy command can be combined with (or otherwise used to refine) the read results of the higher-accuracy command. Consider, for example, the above-mentioned configuration in which both the controller and the memory device are capable of performing interference cancellation. In such a configuration, the controller may initially read the page with a fast read command that performs no interference cancellation. If the ECC fails, the controller re-reads the page with a command that activates the memory device's interference cancellation mechanism. If the ECC fails again, the memory controller may apply both the memory device's and the memory controller's interference cancellation mechanisms.

In some embodiments, the memory device and memory controller support a command interface, using which the memory controller instructs the memory device to execute the appropriate read commands. Such commands may instruct the memory controller to apply a certain predefined read command (e.g., a command having a certain sense time), to activate or deactivate a certain signal processing mechanism implemented internally to the memory device, to set attribute values such as read thresholds or interference cancellation parameters, and/or to instruct the memory device to perform any suitable action or configure any suitable attribute in order to execute the read commands described herein.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
defining at least first and second read commands for reading storage values from analog memory cells, such that the first read command reads the storage values at a first accuracy and the second read command reads the storage values at a second accuracy, which is finer than the first accuracy;
evaluating a condition with respect to a read operation that is to be performed over a given group of the memory cells;
selecting one of the first and second read commands responsively to the evaluated condition; and
reading the storage values from the given group of the memory cells using the selected read command.

2. The method according to claim 1, wherein the first read command has a first execution time, and wherein the second read command has a second execution time that is longer than the first execution time.

3. The method according to claim 1, wherein reading the storage values comprises sensing the storage values over a first sense time duration when using the first read command, and sensing the storage values over a second sense time duration, which is longer than the first sense time duration, when using the second read command.

4. The method according to claim 1, wherein reading the storage values comprises comparing the read storage values to a first number of read thresholds when using the first read command, and comparing the read storage values to a second number of the read thresholds, which is larger than the first number, when using the second read command.

5. The method according to claim 1, wherein reading the storage values comprises applying to the read storage values a first signal processing process having a first execution time when using the first read command, and applying to the read storage values a second signal processing process having a second execution time, which is longer than the first execution time, when using the second read command.

6. The method according to claim 5, wherein the analog memory cells are comprised in a memory device that is connected to a memory controller, wherein applying the first signal processing process comprises performing the first signal processing process by circuitry comprised in the memory device, and wherein applying the second signal processing process comprises performing the second signal processing process by the memory controller.

7. The method according to claim 6, wherein the first and second signal processing processes comprise interference cancellation processes.

8. The method according to claim 1, wherein reading the storage values comprises comparing the read storage values to one or more read thresholds, adaptively adjusting the read thresholds when using the second read command, and refraining from adaptively adjusting the read thresholds when using the first read command.

9. The method according to claim 1, wherein reading the storage values comprises canceling interference in the read storage values when using the second read command, and refraining from canceling the interference when using the first read command.

10. The method according to claim 1, wherein reading the storage values comprises producing respective hard metrics of the read storage values when using the first read command, and producing respective soft metrics of the read storage values when using the second read command.

11. The method according to claim 1, wherein the storage values in the given group of the memory cells represent stored data, and wherein evaluating the condition and selecting the one of the read commands comprise making an attempt to read the storage values from the memory cells in the group and to reconstruct the stored data, and selecting the one of the first and second read commands responsively to the attempt.

12. The method according to claim 11, wherein the stored data is encoded with an Error Correction Code (ECC), and wherein making the attempt comprises decoding the ECC.

13. The method according to claim 11, wherein making the attempt comprises reading the storage values using the first read command, and, responsively to a failure in reconstructing the stored data, re-attempting to read the storage values and reconstruct the stored data using the second read command.

14. The method according to claim 13, wherein re-attempting to reconstruct the stored data comprises reconstructing the stored data using both the storage values read by the first read command and the re-read storage values read using the second read command.

15. The method according to claim 1, wherein evaluating the condition comprises assessing a wear level of the group of the memory cells.

16. The method according to claim 1, wherein evaluating the condition and selecting the one of the read commands comprise selecting the first read command responsively to determining that the read operation reads the storage values from potentially-interfering memory cells in an interference cancellation process.

17. The method according to claim 1, wherein evaluating the condition and selecting the one of the read commands comprise selecting the first read command responsively to determining that the read operation verifies the storage values that were written into the given group of the memory cells.

18. The method according to claim 1, wherein each of the memory cells in the given group stores at least first and second bits, and wherein evaluating the condition and selecting the one of the read commands comprise selecting the first read command responsively to determining that the read operation reads the first bits from the memory cells, and selecting the second read command responsively to determining that the read operation reads the second bits from the memory cells.

19. The method according to claim 1, wherein evaluating the condition and selecting the one of the read commands comprise selecting the first read command responsively to determining that the read operation is used for estimating a statistical distribution of the storage values that were written into the given group of the memory cells.

20. The method according to claim 1, wherein the read commands have respective attributes, and wherein defining the read commands comprises configuring at least one of the attributes.

21. The method according to claim 20, wherein configuring the at least one attribute comprises estimating an impairment in the analog memory cells, and setting the attribute responsively to estimated impairment.

22. Apparatus for data storage, comprising:
a plurality of analog memory cells; and
circuitry, which is configured to execute at least first and second read commands for reading storage values from the analog memory cells, such that the first read command reads the storage values at a first accuracy and the second read command reads the storage values at a second accuracy that is finer than the first accuracy, and which is operative to evaluate a condition with respect to a read operation that is to be performed over a given group of the memory cells, to select one of the first and second read commands responsively to the evaluated condition, and to read the storage values from the given group of the memory cells using the selected read command.

23. The apparatus according to claim 22, wherein the analog memory cells are arrayed in a memory device, and wherein the circuitry comprises:
first circuitry, which is comprised in the memory device and is coupled to receive the selected one of the first and second read commands over an interface and to read the storage values at a respective one of the first and second accuracies; and
second circuitry, which is separate from the memory device and is coupled to evaluate the condition, to select the one of the first and second read commands and to send the selected command to the first circuitry over the interface for execution.

24. The apparatus according to claim 22, wherein the first read command has a first execution time, and wherein the second read command has a second execution time that is longer than the first execution time.

25. The apparatus according to claim 22, wherein the circuitry is configured to sense the storage values over a first sense time duration when executing the first read command, and to sense the storage values over a second sense time duration that is longer than the first sense time duration when executing the second read command.

26. The apparatus according to claim 22, wherein the circuitry is configured to compare the read storage values to a first number of read thresholds when executing the first read command, and to compare the read storage values to a second number of the read thresholds that is larger than the first number when executing the second read command.

27. The apparatus according to claim 22, wherein the circuitry is configured to apply to the read storage values a first signal processing process having a first execution time when executing the first read command, and to apply to the read storage values a second signal processing process having a second execution time, which is longer than the first execution time, when executing the second read command.

28. The apparatus according to claim 27, wherein the analog memory cells are arrayed in a memory device, and wherein the circuitry comprises:
first circuitry, which is comprised in the memory device and is configured to apply the first signal processing process; and
second circuitry, which is separate from the memory device and is configured to apply the second signal processing process.

29. The apparatus according to claim 28, wherein the first and second signal processing processes comprise interference cancellation processes.

30. The apparatus according to claim 22, wherein the circuitry is configured to compare the read storage values to one or more read thresholds, to adaptively adjust the read thresholds when executing the second read command, and to refrain from adaptively adjusting the read thresholds when executing the first read command.

31. The apparatus according to claim 22, wherein the circuitry is configured to cancel interference in the read storage values when executing the second read command, and to refrain from canceling the interference when executing the first read command.

32. The apparatus according to claim 22, wherein the circuitry is configured to produce respective hard metrics of the read storage values when executing the first read command, and to produce respective soft metrics of the read storage values when executing the second read command.

33. The apparatus according to claim 22, wherein the storage values in the given group of the memory cells represent stored data, and wherein the circuitry is configured to make an attempt to read the storage values from the memory cells in the group and to reconstruct the stored data, and to select the one of the first and second read commands responsively to the attempt.

34. The apparatus according to claim 33, wherein the stored data is encoded with an Error Correction Code (ECC), and wherein the circuitry is configured to reconstruct the stored data by decoding the ECC.

35. The apparatus according to claim 33, wherein the circuitry is configured to read the storage values using the first read command, and, responsively to a failure in reconstructing the stored data, to re-attempt to read the storage values and reconstruct the stored data using the second read command.

36. The apparatus according to claim 33, wherein the circuitry is configured to re-attempt to reconstruct the stored data using both the storage values read by the first read command and the re-read storage values read using the second read command.

37. The apparatus according to claim 22, wherein the circuitry is configured to evaluate the condition by assessing a wear level of the group of the memory cells.

38. The apparatus according to claim 22, wherein the circuitry is configured to select the first read command responsively to determining that the read operation reads the storage values from potentially-interfering memory cells in an interference cancellation process.

39. The apparatus according to claim 22, wherein the circuitry is configured to select the first read command responsively to determining that the read operation verifies the storage values that were written into the given group of the memory cells.

40. The apparatus according to claim 22, wherein each of the memory cells in the given group stores at least first and second bits, and wherein the circuitry is configured to select the first read command responsively to determining that the read operation reads the first bits from the memory cells, and to select the second read command responsively to determining that the read operation reads the second bits from the memory cells.

41. The apparatus according to claim 22, wherein the circuitry is configured to select the first read command responsively to determining that the read operation is used for estimating a statistical distribution of the storage values that were written into the given group of the memory cells.

42. The apparatus according to claim 22, wherein the read commands have respective attributes, and wherein the circuitry is configured to configure at least one of the attributes.

43. The apparatus according to claim 42, wherein the circuitry is configured to estimate an impairment in the analog memory cells, and to set the attribute responsively to estimated impairment.

* * * * *